US012785715B2

(12) United States Patent
Kimura

(10) Patent No.: US 12,785,715 B2
(45) Date of Patent: Nov. 3, 2026

(54) REFERENCE VOLTAGE COMPENSATION FOR DELTA-SIGMA ANALOG-TO-DIGITAL CONVERTER

(71) Applicant: MediaTek Singapore Pte. Ltd., Singapore (SG)

(72) Inventor: Takashi Kimura, Tokyo (JP)

(73) Assignee: Media Tek Singapore Pte. Ltd., Singapore (SG)

( * ) Notice: Subject to any disclaimer, the term of this patent is extended or adjusted under 35 U.S.C. 154(b) by 90 days.

(21) Appl. No.: 18/912,564

(22) Filed: Oct. 10, 2024

(65) Prior Publication Data

US 2025/0125818 A1 Apr. 17, 2025

Related U.S. Application Data

(60) Provisional application No. 63/589,648, filed on Oct. 12, 2023.

(51) Int. Cl.
*H03M 1/10* (2006.01)
*H03M 3/00* (2006.01)

(52) U.S. Cl.
CPC ............. *H03M 3/49* (2013.01); *H03M 3/464* (2013.01)

(58) Field of Classification Search
CPC .......... H03M 1/66; H03M 3/464; H03M 3/37; H03M 3/424; H03M 3/454; H03M 3/43; H03M 3/496; H03M 1/1014; H03M 1/1061; H03M 3/34; H03M 3/356; H03M 3/368; H03M 3/372; H03M 3/394; H03M 3/422; H03M 3/426; H03M 3/434; H03M 3/456; H03M 3/462; H03M 3/482; H03M 3/484; H03M 3/49; H03M 3/492; H03M 3/504; H03M 1/06; H03M 1/0607; H03M 1/066; H03M 1/0863; H03M 1/1004; H03M 1/1009; H03M 1/1047; H03M 1/1071; H03M 1/12; H03M 1/1295; H03M 1/181; H03M 1/466; H03M 1/468; H03M 1/50;

(Continued)

(56) References Cited

U.S. PATENT DOCUMENTS 5,030,954 A * 7/1991 Ribner .................... H03M 3/47 341/172
5,319,370 A * 6/1994 Signore .................. G12B 13/00 341/120

(Continued)

*Primary Examiner* — Linh V Nguyen
(74) *Attorney, Agent, or Firm* — Winston Hsu

(57) ABSTRACT

The present invention provides a delta-sigma ADC, wherein the delta-sigma ADC includes an adder, a loop filter, a quantizer, a DAC and a reference voltage compensator. The adder is configured to subtract a feedback signal from an input signal to generate a first signal. The loop filter is configured to receive the first signal to generate at least one filtered signal. The quantizer is configured to generate a digital output signal according to the at least one filtered signal. The DAC is configured to perform a digital-to-analog conversion operation on the digital output signal to generate the feedback signal. The reference voltage compensator is configured to compensate a reference voltage to generate an adjusted reference voltage according to the digital output signal, wherein the adjusted reference voltage is used by the DAC to perform the digital-to-analog conversion operation on the digital output signal to generate the feedback signal.

8 Claims, 4 Drawing Sheets

(58) Field of Classification Search
CPC .......... H03M 1/742; H03M 3/02; H03M 3/30; H03M 3/322; H03M 3/3283; H03M 3/3287; H03M 3/338; H03M 3/348; H03M 3/352; H03M 3/374; H03M 3/38; H03M 3/382; H03M 3/39; H03M 3/396; H03M 3/444; H03M 3/452; H03M 3/458; H03M 3/47; H03M 3/494
USPC .................................. 341/118–120, 143, 172
See application file for complete search history.

(56) References Cited

U.S. PATENT DOCUMENTS

| | | | | |
|---|---|---|---|---|
| 7,391,351 | B2 * | 6/2008 | Pertijs | H03M 3/3287 341/143 |
| 7,414,557 | B2 * | 8/2008 | Andersson | H03M 3/464 341/120 |
| 7,948,412 | B2 * | 5/2011 | Aiba | H03M 3/372 341/143 |
| 8,842,030 | B1 * | 9/2014 | Fontaine | H03M 3/368 341/143 |
| 9,106,255 | B1 * | 8/2015 | Zhang | H03M 3/37 |
| 2002/0105449 | A1 * | 8/2002 | Schreier | H03M 3/482 341/139 |
| 2010/0171643 | A1 * | 7/2010 | Hong | H03M 3/37 341/118 |
| 2016/0056838 | A1 * | 2/2016 | Zhang | H03M 3/422 341/143 |
| 2021/0126648 | A1 * | 4/2021 | Zhang | H03M 1/1061 |
| 2022/0100220 | A1 * | 3/2022 | Mesgarani | G01K 7/01 |

* cited by examiner

REFERENCE VOLTAGE COMPENSATION FOR DELTA-SIGMA ANALOG-TO-DIGITAL CONVERTER

CROSS REFERENCE TO RELATED APPLICATIONS

This application claims the benefit of U.S. Provisional Application No. 63/589,648, filed on Oct. 12, 2023. The content of the application is incorporated herein by reference.

BACKGROUND

A conventional delta-sigma analog-to-digital converter (ADC) generally includes a reference voltage generator for providing a reference voltage to a digital-to-analog converter (DAC) within the delta-sigma ADC. The delta-sigma ADC operates in a sampling phase and a transferring phase alternately, wherein the reference voltage generator is disconnected from sampling capacitors during the sampling phase, and the reference voltage generator is coupled to the sampling capacitors during the transferring phase. When the delta-sigma ADC operating in a transferring phase, the reference voltage generator provides withdrawn charges to the sampling capacitors, however, the amount of withdrawn charges is non-linear for an input signal of the delta-sigma ADC because it is dependent on input signal of the delta-sigma ADC and an output signal of a quantizer, thus causing the reference voltage to be fluctuated. The reference voltage fluctuation will degrade the total harmonic distortion (THD) performance.

SUMMARY

It is therefore an objective of the present invention to provide a delta-sigma ADC, which has a reference voltage compensator configured to stabilize the reference voltage used by the DAC, to solve the above-mentioned problems.

According to one embodiment of the present invention, a delta-sigma ADC is disclosed. The delta-sigma ADC comprises an adder, a loop filter, a quantizer, a DAC and a reference voltage compensator. The adder is configured to subtract a feedback signal from an input signal to generate a first signal. The loop filter is configured to receive the first signal to generate at least one filtered signal. The quantizer is configured to generate a digital output signal according to the at least one filtered signal. The DAC is configured to perform a digital-to-analog conversion operation on the digital output signal to generate the feedback signal. The reference voltage compensator is configured to compensate a reference voltage to generate an adjusted reference voltage according to the digital output signal, wherein the adjusted reference voltage is used by the DAC to perform the digital-to-analog conversion operation on the digital output signal to generate the feedback signal.

According to one embodiment of the present invention, a control method of a delta-sigma ADC is disclosed. The delta-sigma ADC comprises an adder, a loop filter, a quantizer and a DAC. The adder is configured to subtract a feedback signal from an input signal to generate a first signal. The loop filter is configured to receive the first signal to generate at least one filtered signal. The quantizer is configured to generate a digital output signal according to the at least one filtered signal. The DAC is configured to perform a digital-to-analog conversion operation on the digital output signal to generate the feedback signal. The control method comprises the steps of: receiving a reference voltage; and compensating the reference voltage to generate an adjusted reference voltage according to the digital output signal, wherein the adjusted reference voltage is used by the DAC to perform the digital-to-analog conversion operation on the digital output signal to generate the feedback signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
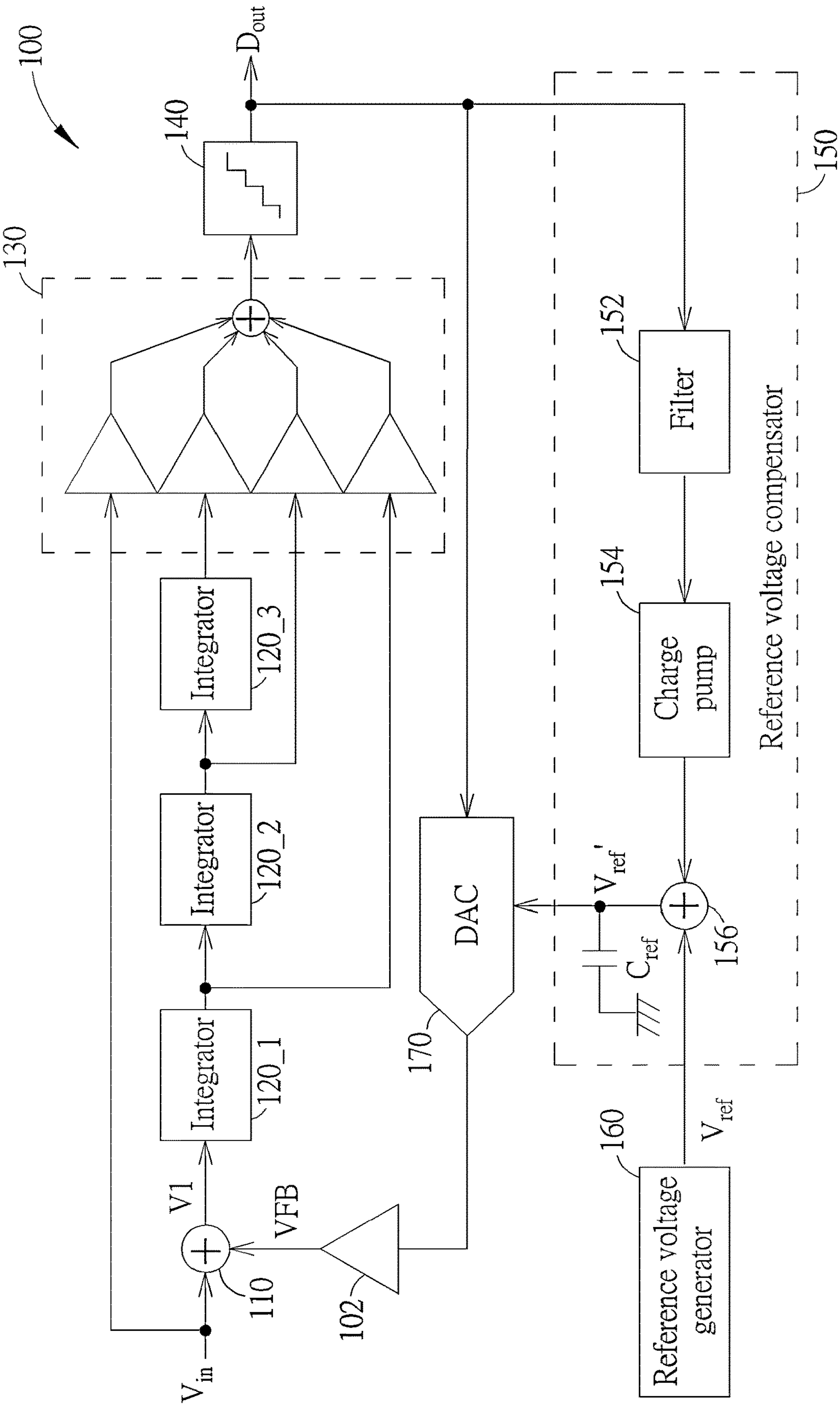
FIG. 1 is a diagram illustrating a delta-sigma ADC according to one embodiment of the present invention.

FIG. 1 is a diagram illustrating a delta-sigma ADC 100 according to one embodiment of the present invention. As shown in FIG. 1, the delta-sigma ADC 100 comprises a buffer 102, an adder 110, a loop filter comprising a plurality of integrators such as 120_1-120_3, a combiner 130, a quantizer 140, a reference voltage compensator 150, a reference voltage generator 160 and a DAC 170, wherein the reference voltage compensator 150 comprises a filter 152, a charge pump 154, a combiner 156 and a reference capacitor Cref.

In the operation of the delta-sigma ADC 100, the adder 110 is configured to subtract a feedback signal VFB from an input signal Vin (analog signal) to generate a first signal V1. The plurality of integrators 120_1-120_3 included in the loop filter are connected in series, and the loop filter is configured to filter the first signal V1 to generate a plurality of filtered signals. The combiner 130 is configured to combine the input signal Vin and the plurality of filtered signals respectively generated by the integrators 120_1-120_3 to generate a combined signal. The quantizer 140 is configured to receive the combined signal to generate a digital output signal Dout. The DAC 170 is configured to perform a digital-to-analog conversion operation on the digital output signal Dout to generate the feedback signal VFB, wherein the feedback signal VFB is inputted into the adder 110 through the buffer 102.

The reference voltage generator 160 is configured to generate a reference voltage Vref for use by the DAC 170. As described in the background of the present invention, the reference voltage Vref generated by the reference voltage generator 160 may be fluctuated due to the non-linear withdrawn charges, so the present invention designs the reference voltage compensator 150 to compensate the reference voltage Vref to generate an adjusted reference voltage Vref' which is more stable. In this embodiment, the reference voltage compensator 150 uses the digital output signal Dout to compensate the reference voltage Vref. Specifically, the filter 152 may be implemented by an infinite impulse response (IIR) filter or a finite impulse response (FIR) filter, and the filter 152 is configured to filter the digital output signal Dout to generate a filtered digital signal. For example, if the digital output signal Dout has seven bits, the filter 152 can have the transfer function as follows (not a limitation of the present invention):

$$H(z)=\left[-3\frac{1+z^{-1}}{2},\,2(1-z^{-1}),\,1-z^{-1},\,0,\,1-z^{-1},\,2(1-z^{-1}),\,-3\frac{1+z^{-1}}{2}\right].$$

The transfer function H (z) has seven weights (i.e., seven gains) respectively corresponding to the seven bits of the digital output signal Dout, wherein the most significant bit and the least significant bit of the digital output signal Dout correspond to the highest weights, and the middle bit(s) of the digital output signal Dout has lower weight.

The charge pump 154 is configured to receive the filtered digital signal to generate a signal to the combiner 156. The combiner 156 combines the signal generated by the charge pump 154 and the reference voltage Vref to generate the adjusted reference voltage Vref' to the reference capacitor Cref. In other words, the bit information of the filtered digital signal (e.g., the information of seven bits of the filtered digital signal) is accumulated as charges at one node of the reference capacitor Cref (the other node of the reference capacitor Cref is coupled to the ground voltage), to generate the adjusted reference voltage Vref'.

In the embodiment shown in FIG. 1, by using the digital output signal Dout to compensate the reference voltage Vref, the reference voltage used by the DAC 170 can be stabilized with a lower level of fluctuation, so the THD performance of the delta-sigma ADC 100 can be improved.

Figure 2:
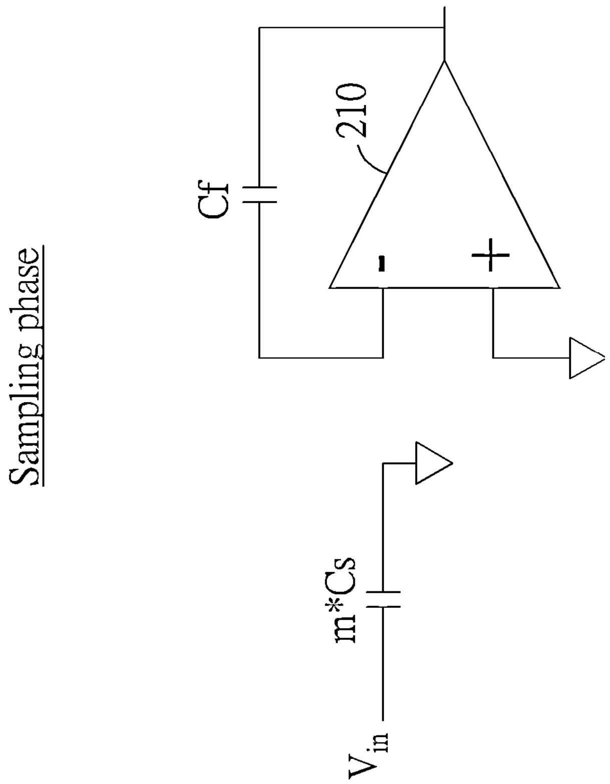
FIG. 2 shows a sampling phase of the delta-sigma ADC according to one embodiment of the present invention
Figure 3:
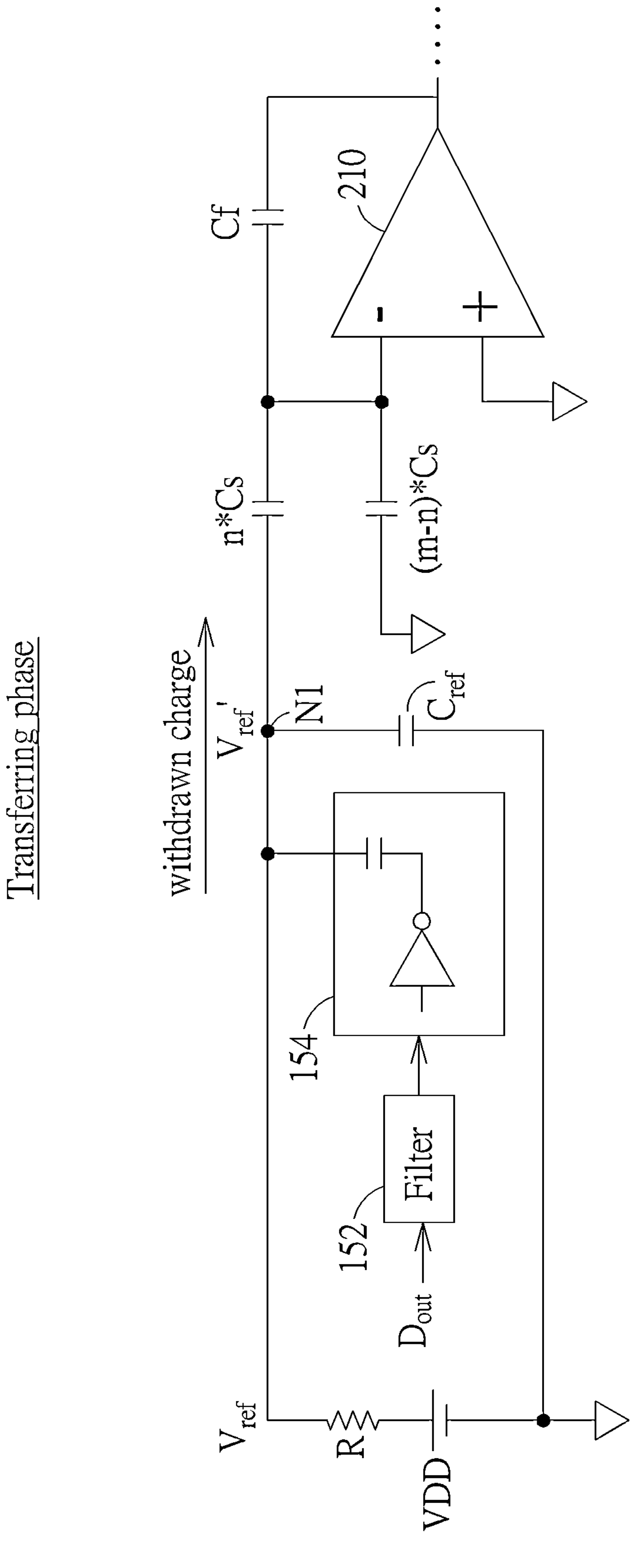
FIG. 3 shows a transferring phase of the delta-sigma ADC according to one embodiment of the present invention

In addition, the delta-sigma ADC 100 operates in a sampling phase and a transferring phase alternately, to convert the input signal Vin into the digital output signal Dout. FIG. 2 shows the sampling phase according to one embodiment of the present invention, wherein sampling capacitors m*Cs is connected to the input signal Vin, and the following integrator is disconnected from the sampling capacitors m*Cs (in this embodiment, an amplifier 210 with a feedback capacitor Cf serve as the integrators 120_1-120_3). FIG. 3 shows the transferring phase according to one embodiment of the present invention, wherein the sampling capacitors m*Cs is disconnected from the input signal Vin, at least part of the sampling capacitors n*Cs is connected to the adjusted reference voltage Vref' ('n' is an integer equal to or less than 'm'), and the remaining part of the sampling capacitors (m−n)*Cs is coupled to a ground voltage. In FIG. 3, a supply voltage with a resistor R serves as the reference voltage generator 160, an inverter and a capacitor are used to represent the charge pump 154, and a node N1 is used to implement the combiner 156. In addition, the withdrawn charges provided by the reference voltage generator 160 to the sampling capacitors will be stabilized by using the charges provided by the charge pump 154.

Figure 4:
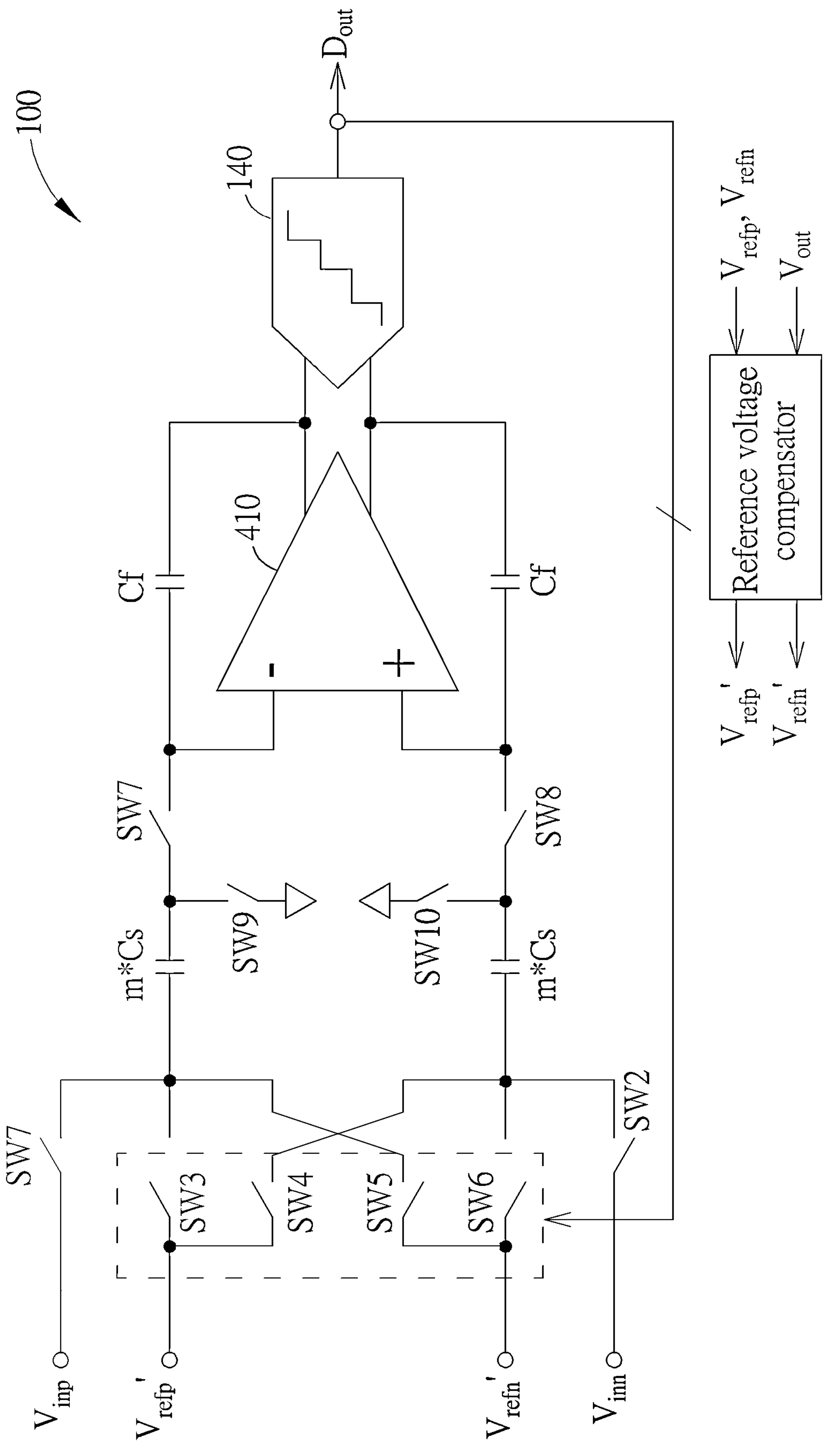
FIG. 4 is a diagram illustrating the circuit structure of the adder, the integrators and the DAC of the delta-sigma ADC according to one embodiment of the present invention.

FIG. 4 is a diagram illustrating the circuit structure of the adder 110, the integrators 120_1-120_3 and the DAC 170 of the delta-sigma ADC 100 according to one embodiment of the present invention. As shown in FIG. 4, the delta-sigma ADC 100 receives a differential input signal Vinp and Vinn and two adjusted reference voltages Vrefp' and Vrefn', wherein the adjusted reference voltages Vrefp' and Vrefn' are generated by the reference voltage compensator 150 receiving two reference voltages Vrefp and Vrefn and the digital output signal Dout. The differential input signal Vinp and Vinn and two reference voltages Vrefp and Vrefn are selectively connected to the sampling capacitors m*Cs by controlling the switches SW1-SW6, and the sampling capacitors m*Cs are selectively connected to the following integrator (in this embodiment, an amplifier 410 with a feedback capacitor Cf serve as the integrators 120_1-120_3) by controlling the switches SW7-SW10. In the embodiment shown in FIG. 4, the sampling capacitors m*Cs are also used as the feedback capacitors to compensate the signal-dependent charge during the switching of the feedback capacitors m*Cs.

It is noted that FIG. 4 only shows the simplified circuit structure of part of the delta-sigma ADC 100, and the circuit structure is not a limitation of the present invention.

Briefly summarized, in the delta-sigma ADC of the present invention, by using the digital output signal to compensate the reference voltage, the reference voltage used by the DAC of the delta-sigma ADC can be stabilized with a lower level of fluctuation, so the THD performance of the delta-sigma ADC can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delta-sigma analog-to-digital converter (ADC), comprising:

an adder, configured to subtract a feedback signal from an input signal to generate a first signal;

a loop filter, configured to receive the first signal to generate at least one filtered signal;

a quantizer, configured to generate a digital output signal according to the at least one filtered signal;

a digital-to-analog converter (DAC), configured to perform a digital-to-analog conversion operation on the digital output signal to generate the feedback signal;

a reference voltage compensator, configured to compensate a reference voltage to generate an adjusted reference voltage according to the digital output signal, wherein the adjusted reference voltage is used by the DAC to perform the digital-to-analog conversion operation on the digital output signal to generate the feedback signal;

wherein the reference voltage compensator comprises:

a filter, configured to filter the digital output signal to generate a filtered digital signal;

a charge pump, configured to receive the filtered digital signal to generate a signal; and a combiner, configured to combine the reference voltage with the signal to generate the adjusted reference voltage.

2. The delta-sigma ADC of claim 1, wherein the reference voltage compensator further comprises:

a reference capacitor, wherein one node of the reference capacitor is coupled to the combiner, another node the reference capacitor is coupled to a ground voltage, and the one node of the reference capacitor is used to provide the adjusted reference voltage.

3. The delta-sigma ADC of claim 1, wherein the filter is an infinite impulse response (IIR) filter or a finite impulse response (FIR) filter.

4. The delta-sigma ADC of claim 1, wherein a transfer function of the filter has a plurality weights respectively corresponding to a plurality of bits of the digital output signal.

5. The delta-sigma ADC of claim 1, wherein sampling capacitors of the delta-sigma ADC are also served as feedback capacitors to compensate signal-dependent charges during switching of the feedback capacitors.

6. A control method of a delta-sigma analog-to-digital converter (ADC), wherein the delta-sigma ADC comprises:

an adder, configured to subtract a feedback signal from an input signal to generate a first signal;

a loop filter, configured to receive the first signal to generate at least one filtered signal;

a quantizer, configured to generate a digital output signal according to the at least one filtered signal;

a digital-to-analog converter (DAC), configured to perform a digital-to-analog conversion operation on the digital output signal to generate the feedback signal;

wherein the control method comprises:

receiving a reference voltage; and compensating the reference voltage to generate an adjusted reference voltage according to the digital output signal, wherein the adjusted reference voltage is used by the DAC to perform the digital-to-analog conversion operation on the digital output signal to generate the feedback signal;

wherein compensating the reference voltage to generate the adjusted reference voltage according to the digital output signal comprises:

filtering the digital output signal to generate a filtered digital signal;

using a charge pump to receive the filtered digital signal to generate a signal; and combining the reference voltage with the signal to generate the adjusted reference voltage.

7. The control method of claim 6, wherein filtering the digital output signal to generate the filtered digital signal is performed by using a filter, and the filter is an infinite impulse response (IIR) filter or a finite impulse response (FIR) filter.

8. The control method of claim 7, wherein a transfer function of the filter has a plurality weights respectively corresponding to a plurality of bits of the digital output signal.

* * * * *